(12) United States Patent
Kodama

(10) Patent No.: US 11,621,158 B2
(45) Date of Patent: Apr. 4, 2023

(54) METHOD OF MANUFACTURING SEMICONDUCTOR DEVICE

(71) Applicant: FUJI ELECTRIC CO., LTD., Kawasaki (JP)

(72) Inventor: Naoko Kodama, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 260 days.

(21) Appl. No.: 17/161,908

(22) Filed: Jan. 29, 2021

(65) Prior Publication Data

US 2021/0272797 A1    Sep. 2, 2021

(30) Foreign Application Priority Data

Mar. 2, 2020    (JP) ............... JP2020-035171

(51) Int. Cl.
| | |
|---|---|
| *H01L 21/265* | (2006.01) |
| *H01L 21/02* | (2006.01) |
| *H01L 29/66* | (2006.01) |
| *H01L 29/06* | (2006.01) |
| *H01L 21/311* | (2006.01) |

(52) U.S. Cl.
CPC ...... *H01L 21/02063* (2013.01); *H01L 21/265* (2013.01); *H01L 21/31144* (2013.01); *H01L 29/0696* (2013.01); *H01L 29/66325* (2013.01)

(58) Field of Classification Search
CPC ............ H01L 21/02063; H01L 21/265; H01L 21/31144; H01L 29/0696; H01L 29/66325
See application file for complete search history.

(56) References Cited

U.S. PATENT DOCUMENTS

| | | |
|---|---|---|
| 5,968,713 A | 10/1999 | Nozaki et al. |
| 2016/0329323 A1 | 11/2016 | Iwasaki et al. |
| 2019/0139772 A1 | 5/2019 | Kodama |

FOREIGN PATENT DOCUMENTS

| | | |
|---|---|---|
| JP | 2006-091898 A | 4/2006 |
| JP | 2015-118991 A | 6/2015 |
| WO | 2018/105299 A1 | 6/2018 |

*Primary Examiner* — Samuel A Gebremariam
(74) *Attorney, Agent, or Firm* — Rabin & Berdo, P.C.

(57) ABSTRACT

A method of manufacturing a semiconductor device, including preparing a semiconductor wafer having first and second main surfaces opposite to each other, forming a photoresist film on the first main surface of the semiconductor wafer, forming a plurality of openings at predetermined positions in the photoresist film, cleaning the semiconductor wafer with water after the openings are formed, drying the semiconductor wafer by rotating the semiconductor wafer around a center axis that is orthogonal to the first main surface of the semiconductor wafer, to thereby generate a centrifugal force to cause the water that is left in the openings of the photoresist film to fly off the semiconductor wafer, and ion-implanting a predetermined impurity by a predetermined acceleration energy from the first main surface of the semiconductor wafer, using the photoresist film as a mask, after the drying. The drying process includes setting a rotational speed of the semiconductor wafer to be at most an upper limit value.

10 Claims, 13 Drawing Sheets

FIG.4

| PHOTORESIST FILM THICKNESS | | ROTATIONAL SPEED DURING SEMICONDUCTOR WAFER DRYING | | | | | | |
|---|---|---|---|---|---|---|---|---|
| | | 1000rpm | 1500rpm | 2000rpm | 2500rpm | 3000rpm | 3500rpm | 4000rpm |
| | 40μm | ○ | ○ | ○ | ○ | ○ | × | × |
| | 50μm | ○ | ○ | ○ | ○ | × | × | × |
| | 60μm | ○ | ○ | ○ | × | × | × | × |
| | 70μm | ○ | ○ | × | × | × | × | × |
| | 100μm | ○ | × | × | × | × | × | × |
| | 220μm | ○ | | | | | | |

METHOD OF MANUFACTURING SEMICONDUCTOR DEVICE

CROSS REFERENCE TO RELATED APPLICATIONS

This application is based upon and claims the benefit of priority of the prior Japanese Patent Application No. 2020-035171, filed on Mar. 2, 2020, the entire contents of which are incorporated herein by reference.

BACKGROUND OF THE INVENTION

1. Field of the Invention

Embodiments of the invention relate to a method of manufacturing a semiconductor device.

2. Description of the Related Art

Conventionally, power devices have been disclosed for which characteristics are enhanced and improved by inducing, in a semiconductor substrate, impurity defects that become a carrier lifetime killer; the impurity defects are induced by ion implantation having a deep range by high acceleration energy.

For example, in a reverse conducting insulated gate bipolar transistor (RC-IGBT) in which an insulated gate bipolar transistor (IGBT) and a freewheeling diode (FWD) connected in antiparallel to the IGBT are built into a single semiconductor chip, He defects that become a carrier lifetime killer are formed by irradiating helium (He) to an $n^-$-type drift region.

FIGS. 9 and 10 are cross-sectional views of a structure of a conventional semiconductor device. A conventional semiconductor device 100a depicted in FIG. 9 is an RC-IGBT in which near interfaces between an $n^-$-type drift region 101 and p-type base regions 102, He defects 113 are formed in the $n^-$-type drift region 101 by helium irradiation. The He defects 113 are formed not only in a FWD region 112 but also in an IGBT region 111. The IGBT region 111 is a region in which an IGBT is disposed. The FWD region 112 is a region in which a FWD is disposed.

Further, as depicted in FIG. 10, a RC-IGBT 100b has been proposed in which a dose amount of a helium irradiation for forming a carrier lifetime killer induced in the FWD region 112 is increased to improve characteristics of the FWD region 112 and He defects 114 that become the carrier lifetime killer are formed only in the FWD region 112 so that characteristics (leak current characteristics, ON resistance characteristics) of the IGBT region 111 do not degrade (for example, refer to Japanese Laid-Open Patent Publication No. 2015-118991 and International Publication No. WO 2018/105299).

FIGS. 11 and 12 are cross-sectional views schematically depicting states of ion implantation processes respectively using a photoresist film and a hard mask. In fabricating (manufacturing) an RC-IGBT, to selectively form diffused regions such as $n^+$-type emitter regions 103 and $p^+$-type contact regions 104, an ion implantation 122 of an impurity into a semiconductor wafer 110 is performed using, as a mask (shielding film), a photoresist film 121 opened at portions corresponding to each region (FIG. 11).

Here, the photoresist film 121 of a thickness t101 corresponding to a range of the impurity of the ion implantation 122 is used as a shielding film. The photoresist film 121 is removed by an organic solvent treatment or an incineration treatment (ashing) after the ion implantation 122. A depth (range) of injection 132 of the impurity is deep and in an instance in which the photoresist film does not function as a shielding film, a hard mask 131 such as a metal mask or a silicon (Si) mask may be used as a shielding film (FIG. 12).

When an impurity ion-implantation (or helium irradiation) 132 is performed using the hard mask 131 as a shielding film, using an alignment mask preformed on the semiconductor wafer 110 as a reference, the semiconductor wafer 110 and the hard mask 131 are aligned so that respective main surfaces thereof face each other. Subsequently, the hard mask 131 is fixed to the semiconductor wafer 110 so that the main surface of the semiconductor wafer 110 is not in contact with the main surface of the hard mask 131.

Any one of various methods for fixing the hard mask 131 to the semiconductor wafer 110 may be used provided that positioning of the semiconductor wafer 110 and the hard mask 131 does not shift when the semiconductor wafer 110 is conveyed to an ion implantation apparatus (or irradiation apparatus, not depicted). For example, the hard mask 131 may be fixed to the semiconductor wafer 110 by a clip (not depicted) or may be fixed using a screw (not depicted).

Subsequently, the impurity ion-implantation (or helium irradiation) 132 is performed on the semiconductor wafer 110 to which the hard mask 131 is fixed, the impurity ion-implantation (or helium irradiation) 132 being performed by a high acceleration energy, from a side having the hard mask 131. As a result, a predetermined ion species (or He defects) of the ion implantation (or helium irradiation) 132 is introduced (induced) in only predetermined portions of the semiconductor wafer 110 exposed in openings 131a of the hard mask 131.

Further, a method of forming a thick photoresist film to be used as a shielding film has been proposed (for example, refer to International Publication No. WO 2018/105299). In International Publication No. WO 2018/105299, rotational speeds of the semiconductor wafer at each process during formation of the photoresist film are specified, ensuring a desired film thickness of the photoresist film, whereby a predetermined impurity is implanted with positioning accuracy in predetermined regions using the photoresist film as a shielding film.

Further, a method has been proposed in which an alicyclic hydrocarbon group is kept away from a main chain, whereby rigidity of the photoresist film caused by the alicyclic hydrocarbon group is mitigated and distortion occurring during development of the photoresist film decreases (for example, refer to Japanese Laid-Open Patent Publication No. 2006-091898). In Japanese Laid-Open Patent Publication No. 2006-091898, distortion occurring in a thick photoresist film during development is reduced and an occurrence of cracks in the photoresist film is prevented.

SUMMARY OF THE INVENTION

According to an embodiment of the invention, a method of manufacturing a semiconductor device includes preparing a semiconductor wafer, the semiconductor wafer having a first main surface and a second main surface opposite to each other; a formation process including forming a photoresist film on the first main surface of the semiconductor wafer; a developing process including forming a pattern of a plurality of openings at predetermined positions in the photoresist film; a cleaning process including cleaning the semiconductor wafer with water after the developing process; a drying process including drying the semiconductor wafer by rotating the semiconductor wafer around a center axis that is orthogonal to the first main surface of the semiconductor wafer, to thereby generate a centrifugal force to cause the water that is left in the openings of the photoresist film after the cleaning process to fly off the semiconductor wafer; and an injection process including ion-implanting a predetermined impurity by a predetermined acceleration energy from the first main surface of the semiconductor wafer, using the photoresist film as a mask, after the drying process. The drying process includes setting a rotational speed of the semiconductor wafer to be at most an upper limit value.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 4 is a table depicting a relationship between photoresist film thickness and rotational speed during drying of a semiconductor wafer.

DETAILED DESCRIPTION OF THE INVENTION

First, problems associated with the conventional techniques are discussed. Positioning accuracy of the semiconductor wafer 110 and the hard mask 131 (refer to FIG. 12) is about ±50 μm; thus, the accuracy is lower compared to alignment accuracy (about ±1.5 μm) of the photoresist film 121 (refer to FIGS. 11 and 13) formed by photolithography. Therefore, greater design margins are necessary, whereby increased chip size may occur. Further, with increased chip size, a problem arises in that the number of chips that can be cut from a single semiconductor wafer decreases, thereby increasing cost.

Figure 13:
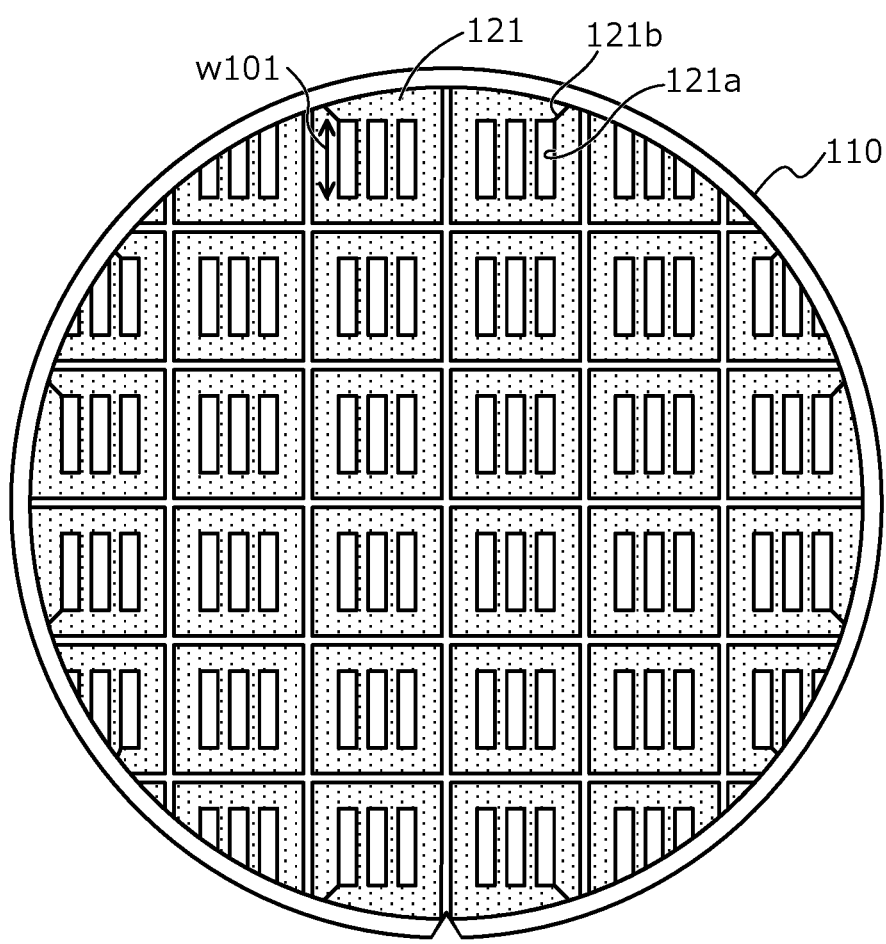
FIG. 13 is a plan view depicting a state of the conventional semiconductor device during manufacture, as viewed from a front side of a semiconductor wafer.

On the other hand, in an instance in which the photoresist film 121 is used a shielding film, as described above, the photoresist film 121 has to be formed to have the thickness t101 corresponding to the range of the impurity of the ion implantation 122. In FIG. 13, the photoresist film 121 is indicated by hatching. For example, assuming the range of the impurity of the ion implantation 122 in the photoresist film 121 is twice that in the semiconductor wafer 110, in an instance in which the depth of the impurity ion-implantation 122 to the semiconductor wafer 110 is 0.5 μm, the thickness t101 of the photoresist film 121 as to be 1.0 μm.

Therefore, like helium irradiation or proton ($H^+$) irradiation, when the depth of the impurity ion-implantation 122 into the semiconductor wafer 110 is, for example, 50 μm, the thickness t101 of the photoresist film 121 has to be at least 100 μm. In this manner, in an instance in which the thickness t101 of the photoresist film 121 to be used as a shielding film is increased to be, for example, at least 20 μm, the following problem arises. FIG. 13 is a plan view depicting a state of the conventional semiconductor device during manufacture, as viewed from a front side of the semiconductor wafer.

Figure 11:
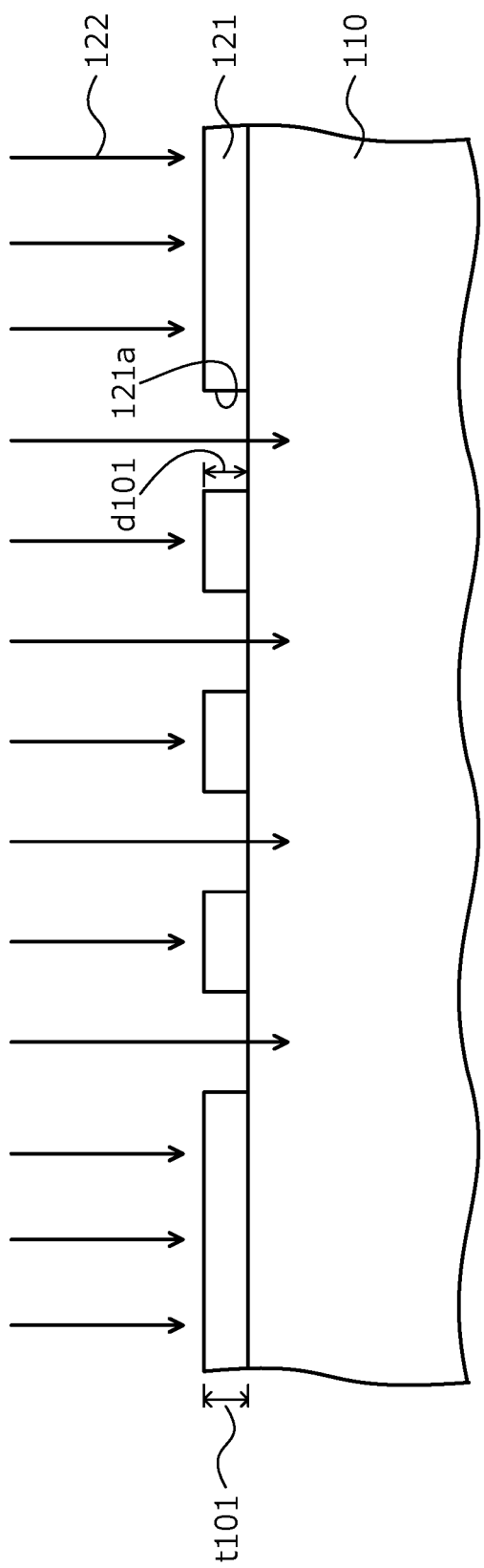
FIG. 11 is a cross-sectional view schematically depicting a state of an ion implantation process using a photoresist film.
Figure 12:
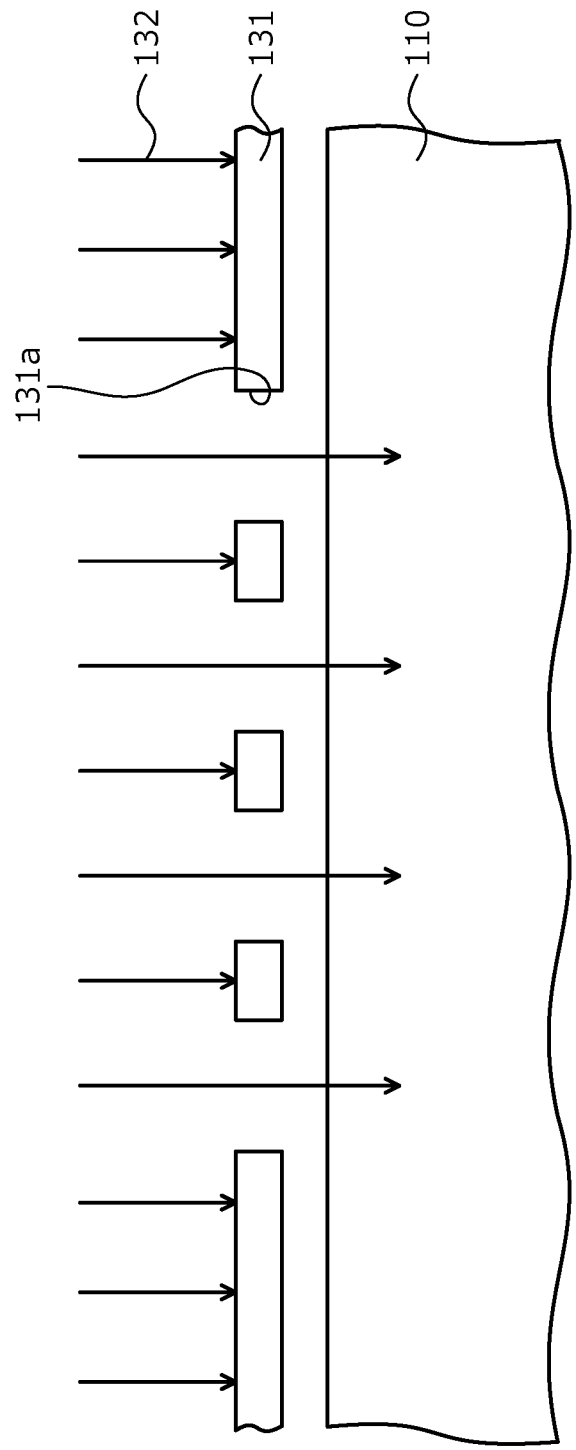
FIG. 12 is a cross-sectional view schematically depicting a state of an ion implantation process using a hard mask.

When the photoresist film 121 is thick and an opening pattern of a mask pattern developed in the photoresist film 121 is large, openings 121a having a deep depth d101 and an opening area (planar area) is as large as, for example, at least 1 $mm^2$ are formed in the photoresist film 121 (refer to FIGS. 11 and 13). The larger is the opening area of the openings 121a of the photoresist film 121, the greater is the volume of water (not depicted) that collects in the openings 121a of the photoresist film 121 due to washing of the semiconductor wafer with water after development.

In an instance in which drying equipment or developing equipment (developer) equipped with a general spinner (rotating support stage that fixes the semiconductor wafer 110) is used, after the semiconductor wafer 110 is washed with water, the semiconductor wafer 110 is rotated at a predetermined rotational speed that is a high speed, around a center axis that is orthogonal to a main surface of the semiconductor wafer 110, whereby centrifugal force is used to cause the water to fly off the surface of the semiconductor wafer 110 and thereby dry the semiconductor wafer 110. At an outer peripheral portion of the semiconductor wafer 110, the centrifugal force becomes particularly strong, whereby a force with which water left in the openings 121a of the photoresist film 121 collides with sidewalls of the openings 121a also increases.

Near the outer peripheral portion of the semiconductor wafer 110, when the force of the water colliding with the sidewalls of the openings 121a of the photoresist film 121 becomes large, cracks (fractures) 121b in the photoresist film 121 occur from the openings 121a that are near an end of the photoresist film 121; the openings 121a each has a closed shape in a plan view thereof. The cracks 121b, for example, occur in the photoresist film 121, from corner portions of the openings 121a, which have a closed substantially rectangular shape in a plan view thereof, and the cracks 121b extend toward the end of the photoresist film 121, in an oblique direction that is substantially 45 degrees with respect to the sidewalls of the openings 121a.

Figure 10:
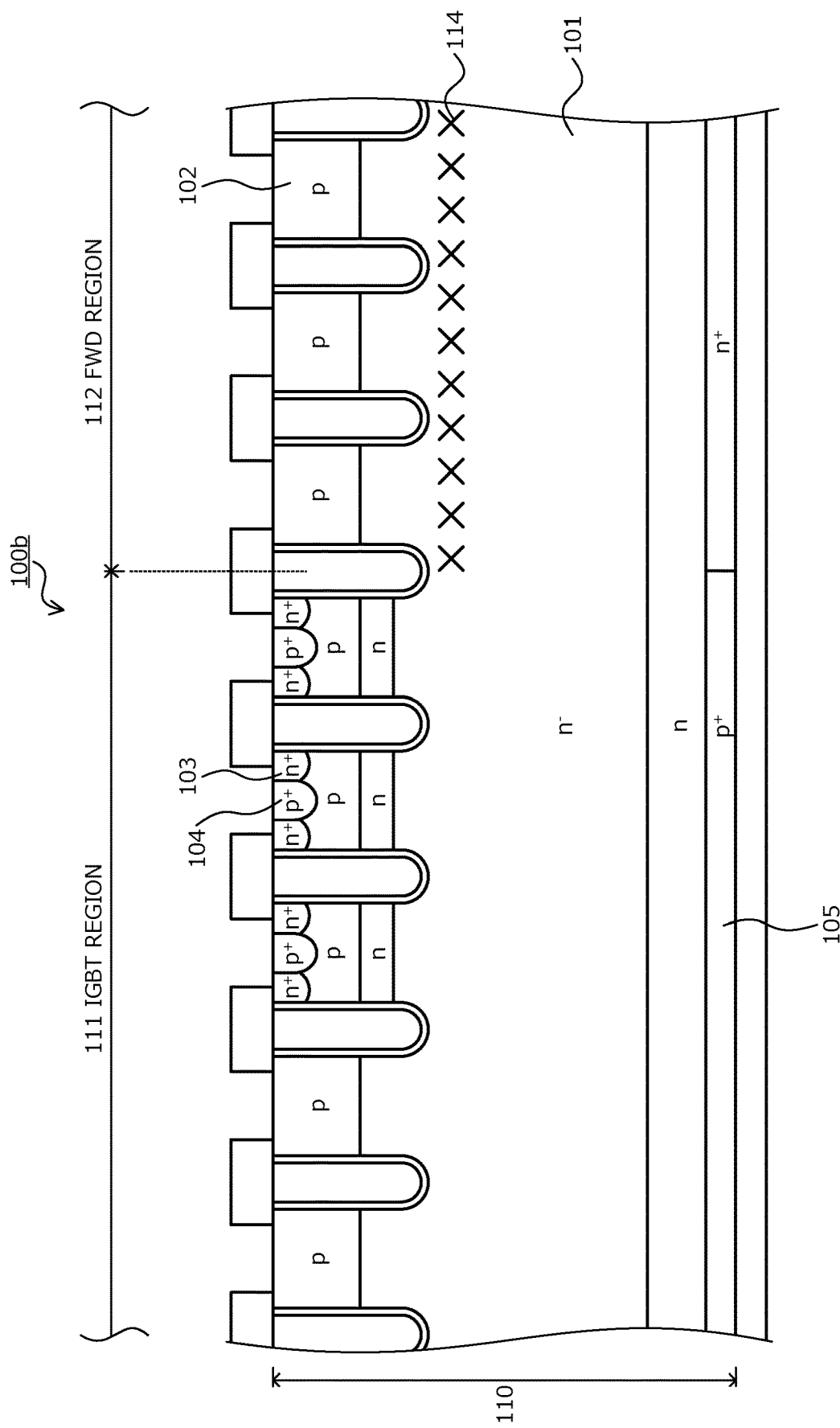
FIG. 10 is a cross-sectional view of a structure of a conventional semiconductor device.

When the cracks 121b occur in the photoresist film 121, shielding performance of the photoresist film 121 decreases. Therefore, for example, in fabricating a RC-IGBT (refer to FIG. 10), when the ion implantation 122 of an impurity is performed with respect to the semiconductor wafer 110 by using the photoresist film 121 as a mask (shielding film), at places other than the predetermined regions (places other than portions exposed in the openings 121a), the dose amount of the impurity is high, whereby defects that become a carrier lifetime killer are induced therein and characteristics (low ON resistances Von and low leak current) of the IGBT region degrade.

Embodiments of a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

Figure 1:
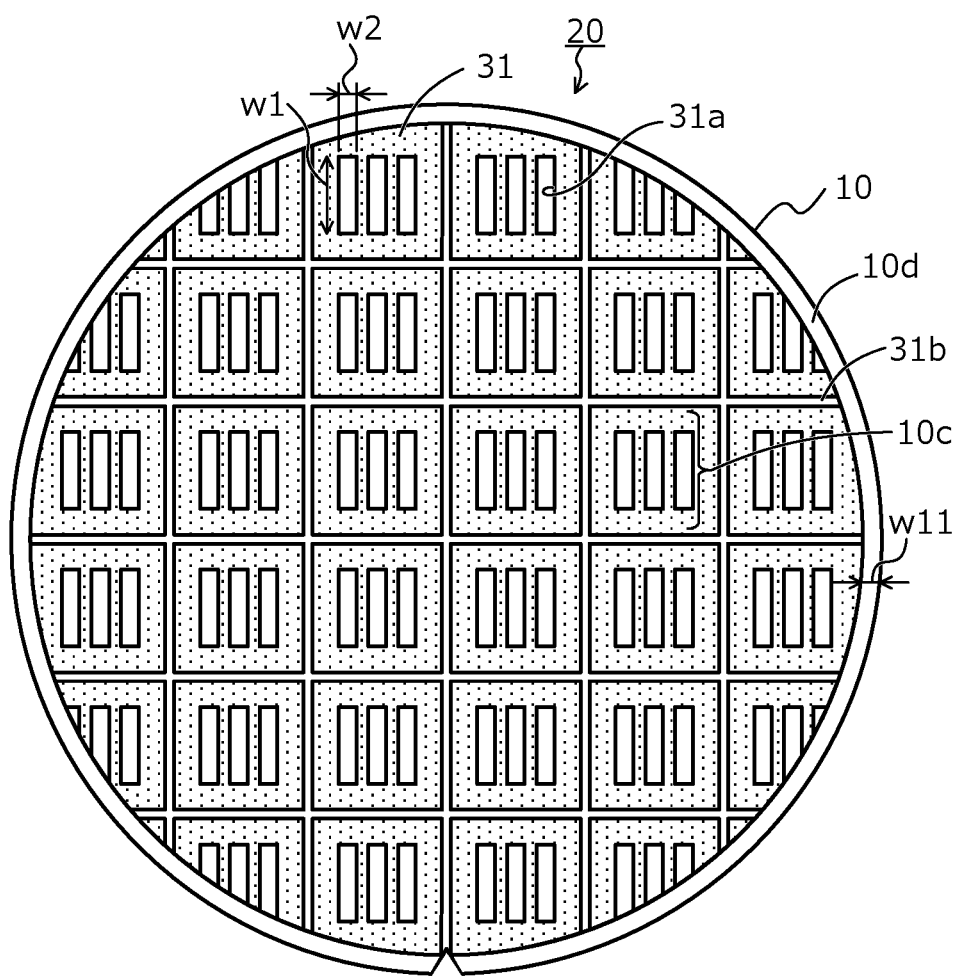
FIG. 1 is a plan view depicting a state of a semiconductor device according to a first embodiment during manufacture, as viewed from a front side of a semiconductor wafer.

A method of manufacturing a semiconductor device according to a first embodiment is described, taking as an example of the semiconductor device according to the first embodiment, an instance of fabricating (manufacturing) a RC-IGBT having a breakdown voltage of 1200V and in which helium defects are induced in a FWD region by helium (He) irradiation. The breakdown voltage is a voltage limit at which no erroneous operation or destruction of a device element occurs. FIG. 1 is a plan view depicting a state of the semiconductor device according to the first embodiment during manufacture, as viewed from a front side of a semiconductor wafer. In FIG. 1, a photoresist film 31 is indicated by hatching.

In FIG. 1, multiple regions having a substantially rectangular shape in a plan view thereof and covered by the photoresist film 31 are each a region (hereinafter, chip region) 10c that becomes an individual semiconductor chip by dicing (cutting) the semiconductor wafer 10. The chip regions 10c, for example, are disposed in a matrix-like layout. In each portion of the photoresist film 31 covering one of the chip regions 10c, multiple openings 31a (three in FIG. 1) are formed. In the openings 31a of the photoresist film 31, different FWD regions 22 are exposed, respectively.

Figure 2:
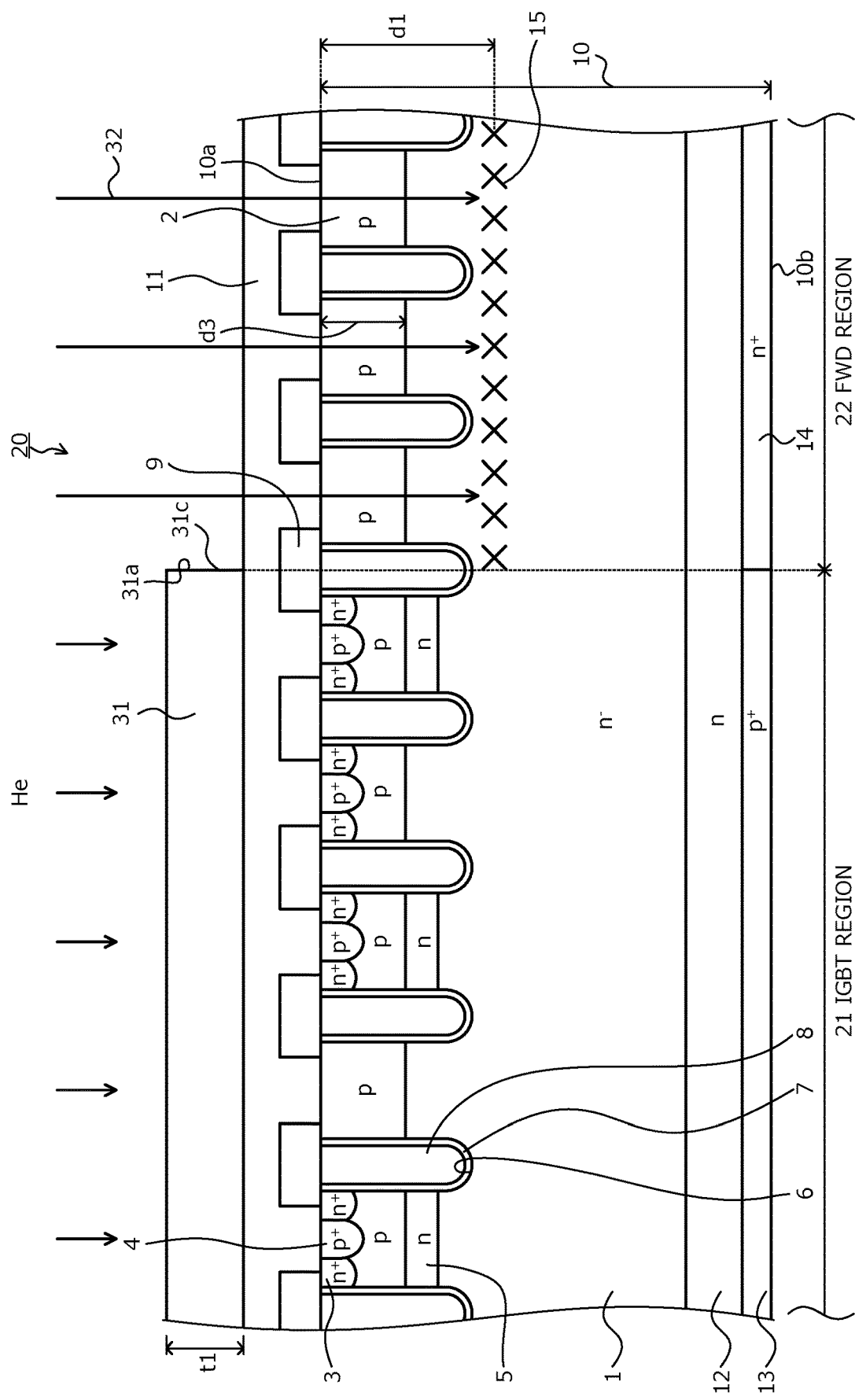
FIG. 2 is an enlarged cross-sectional view of a portion of FIG. 1.

In the semiconductor wafer 10, dicing lines 31b are provided in a grid-like shape, surrounding peripheries of the chip regions 10c. In FIG. 1, the dicing lines 31b of the semiconductor wafer 10 are depicted in an exposed state, the dicing lines 31b of the semiconductor wafer 10 may be covered by the photoresist film 31. FIG. 2 is an enlarged cross-sectional view of a portion of FIG. 1. In FIG. 2, while regions near a border between an IGBT region 21 and the FWD region 22 of one of the chip regions 10c are depicted, all of the chip regions 10c are similarly configured.

An RC-IGBT 20 depicted in FIGS. 1 and 2, for example, is formed by integrating an IGBT having trench-gate structure and a FWD connected in antiparallel to the IGBT on a single semiconductor substrate (semiconductor chip). In particular, in an active region on the single semiconductor substrate, the IGBT regions 21 that are regions operating as the IGBT and the FWD regions 22 that are regions operating as the FWD are provided to be adjacent to one another. The IGBT regions 21 and the FWD regions 22, for example, each have a substantially rectangular shape in plan views thereof and are disposed to repeatedly alternate one another in a direction parallel to a front surface of the semiconductor substrate.

The active region is a region through which current flows during an ON state and, for example, is disposed in a center portion of the semiconductor substrate. An edge termination region is a region between the active region and the end of the semiconductor substrate (chip end) and surrounds a periphery of the active region. The edge termination region has a function of mitigating electric field of a front side of the semiconductor substrate and sustaining the breakdown voltage. In the edge termination region, a voltage withstanding structure such as a field limiting ring (FLR) or a field plate is disposed.

First, as depicted in FIG. 2, the semiconductor wafer 10 of an $n^-$-type and forming an $n^-$-type drift layer 1 is prepared. A front surface 10a of the semiconductor wafer 10 may be, for example, a (001) plane. The semiconductor wafer 10 has a thickness (thickness before back grinding described hereinafter) that may be, for example, 725 μm. Next, a process including photolithography and ion implantation as one set is performed repeatedly under different conditions, whereby p-type base regions 2, $n^+$-type emitter regions 3, and $p^+$-type contact regions 4 of the IGBTs are formed in regions of the semiconductor wafer 10, at the front surface 10a thereof.

The p-type base regions 2 are formed in an entire area of the active region, spanning the IGBT regions 21 and the FWD regions 22. The p-type base regions 2 also serve as p-type anode regions in the FWD regions 22. In the IGBT regions 21, the $n^+$-type emitter regions 3 and the $p^+$-type contact regions 4 are selectively provided between the front surface 10a of the semiconductor wafer 10 and the p-type base regions 2. A portion of the semiconductor wafer 10 between the p-type base regions 2 and an n-type field stop (FS) layer 12 described hereinafter is the $n^-$-type drift layer 1.

In the IGBT regions 21, between the $n^-$-type drift layer 1 and the p-type base regions 2, n-type accumulation layers 5 may be formed by photolithography and ion implantation. The n-type accumulation layers 5 become barriers of minority carriers (holes) of the $n^-$-type drift layer 1 during turn ON of the IGBTs and have a function of storing minority carriers in the $n^-$-type drift layer 1. Next, the front surface 10a of the semiconductor wafer 10 is thermally oxidized, thereby forming in each edge termination region, a field oxide film (not depicted) that covers the front surface 10a of the semiconductor wafer 10.

Next, by photolithography and etching, trenches 6 are formed in the IGBT regions 21 and the FWD regions 22. The trenches 6 are disposed having a stripe pattern as viewed from the front surface 10a of the semiconductor wafer 10 and, for example, extend in a direction (direction of view of FIG. 2) orthogonal to a direction along which the IGBT regions 21 and the FWD regions 22 are arranged. The trenches 6 of the IGBT regions 21 penetrate the $n^+$-type emitter regions 3, the p-type base regions 2 and the n-type accumulation layers 5 and reach the $n^-$-type drift layer 1.

In the IGBT regions 21, between adjacent trenches 6 of the trenches 6, as viewed from the front surface 10a of the semiconductor wafer 10, the p-type base regions 2, the $n^+$-type emitter regions 3, and the $p^+$-type contact regions 4 may extend linearly along the trenches 6 or the $n^+$-type emitter regions 3 and the $p^+$-type contact regions 4 may be distributed at predetermined intervals along the trenches 6.

The trenches 6 of the FWD regions 22 penetrate the p-type base regions 2 (p-type anode regions) and reach the n⁻-type drift layer 1.

Next, for example, a semiconductor surface (the front surface 10a of the semiconductor wafer 10 and inner walls of the trenches 6) is thermally oxidized, thereby forming gate insulating films 7 along the semiconductor surface. Next, on the front surface 10a of the semiconductor wafer 10, a polysilicon (poly-Si) layer is formed on the gate insulating films 7 so as to be embedded in the trenches 6. Next, the polysilicon layer is, for example, etched until the gate insulating films 7 on the front surface 10a of the semiconductor wafer 10 are exposed, leaving only portions of the polysilicon layer that become gate electrodes 8 in the trenches 6.

Thus, MOS gates (insulated gates formed by a metal, an oxide film, and a semiconductor) of the IGBTs are formed in the IGBT regions 21, the MOS gates having a trench gate structure configured by the p-type base regions 2, the $n^+$-type emitter regions 3, the $p^+$-type contact regions 4, the trenches 6, the gate insulating films 7, and the gate electrodes 8. The $n^+$-type emitter regions 3, the $p^+$-type contact regions 4, and the n-type accumulation layers 5 may be formed after the gate electrodes 8 are formed. The $n^+$-type emitter regions 3 suffice to be disposed between at least one pair of adjacent trenches 6 of the trenches 6.

Next, on the front surface 10a of the semiconductor wafer 10, an interlayer insulating film 9 is formed so as to cover the gate electrodes 8. Next, the interlayer insulating film 9 is selectively removed by photolithography and etching, whereby contact holes penetrating through the interlayer insulating film 9 in a depth direction are formed. In each of the contact holes of the IGBT regions 21, the $n^+$-type emitter regions 3 and the $p^+$-type contact regions 4 between adjacent trenches 6 of the trenches 6 are exposed. In the contact holes of the FWD regions 22, the p-type base regions 2 are exposed.

Next, on the interlayer insulating film 9, a front electrode 11 is formed so as to be embedded in the contact holes. The front electrode 11, in the IGBT regions 21, is electrically connected to the p-type base regions 2, the $n^+$-type emitter regions 3, and the $p^+$-type contact regions 4 and functions as an emitter electrode. The front electrode 11, in the FWD regions 22, is electrically connected to the p-type base regions 2 and functions as an anode electrode. The front electrode 11, in mesa regions in which the $n^+$-type emitter regions 3 are not disposed, may be electrically connected to the p-type base regions 2.

Next, the semiconductor wafer 10 is ground from a back surface 10b thereof (back grinding), to a position corresponding to a product thickness (for example, about 115 μm) for use as a semiconductor device. Next, spanning an entire area of the ground back surface 10b of the semiconductor wafer 10, the n-type field stop layer 12 and an $n^+$-type cathode region 14 are formed at depths different from each other in a surface layer of the semiconductor wafer 10, at the ground back surface 10b thereof. The n-type field stop layer 12 is formed at a position deeper from the ground back surface 10b of the semiconductor wafer 10 than is the $n^+$-type cathode region 14.

Next, portions of the $n^+$-type cathode region 14 corresponding to the IGBT regions 21 are converted to a $p^+$-type by photolithography and ion implantation, thereby forming $p^+$-type collector regions 13. In other words, the $p^+$-type collector regions 13 are formed closer to the ground back surface 10b of the semiconductor wafer 10 than is the n-type field stop layer 12, and are adjacent to the $n^+$-type cathode region 14 in a direction along which the IGBT regions 21 and the FWD regions 22 are arranged. Next, on the front surface 10a of the semiconductor wafer 10, a passivation protective film (not depicted) is formed so as to cover each edge termination region.

Next, the photoresist film 31 opened at portions corresponding to the FWD regions 22 is formed on the front surface 10a of the semiconductor wafer 10. The openings 31a of the photoresist film 31, for example, have a substantially rectangular shape in a plan view thereof, one width (hereinafter, longitudinal width) w1 is significantly larger than another width (hereinafter, lateral width) w2 as viewed from the front surface 10a of the semiconductor wafer 10. For each of the openings 31a of the photoresist film 31, a maximum value of the longitudinal width w1 is, for example, about 10 mm and a maximum value of the lateral width w2 is, for example, in a range from about 200 μm to 300 μm.

The openings 31a of the photoresist film 31 are formed by a general process (photoresist application, exposure, and developing). After the developing, the semiconductor wafer 10 is washed with water (refer to FIG. 3), thereby removing deposits and chemicals on the surface of the semiconductor wafer 10. Water that is left on the surface of the semiconductor wafer 10 and in the openings 31a of the photoresist film 31 by this washing after the developing, as described hereinafter, during drying of the semiconductor wafer 10, is caused to fly off therefrom by centrifugal force generated by rotating the semiconductor wafer 10 at a high speed. Conditions described hereinafter are set for the rotational speed of the semiconductor wafer 10 during this drying of the semiconductor wafer 10.

Next, a helium irradiation 32 having a deep range (for example, at least about 15 μm) is performed by a high acceleration energy using the photoresist film 31 as a mask (shielding film), whereby He defects 15 that become a carrier lifetime killer are induced in the n⁻-type drift layer 1. In an instance in which an injection depth (range) dl of helium by the helium irradiation 32 is about 15 μm from the front surface 10a of the semiconductor wafer 10, a thickness t1 of the photoresist film 31, for example, is increased to be in a range from about 40 μm to 45 μm, to enable the photoresist film 31 to function as a shielding film.

In this manner, the thickness t1 of the photoresist film 31 is increased according to the injection depth dl of helium by the helium irradiation 32. As a result, the He defects 15 are induced only in the n⁻-type drift layer 1 of the FWD regions 22, near borders with the p-type base regions 2 (p-type anode regions) and are not induced in the IGBT regions 21 that are covered by the photoresist film 31. Subsequently, the photoresist film 31 is removed by an organic solvent treatment or an incineration treatment (ashing). Processes performed between the formation and removal of the photoresist film 31 are described in detail hereinafter.

Next, a back electrode (not depicted) in ohmic contact with an entire area of the back surface 10b of the semiconductor wafer 10 is formed. The back electrode is electrically connected to the $p^+$-type collector regions 13 and functions as a collector electrode; and is electrically connected to the $n^+$-type cathode region 14 and functions as a cathode electrode. Thereafter, the semiconductor wafer 10 is cut along the dicing lines 31b (refer to FIG. 1), thereby separating the chip regions 10c of the semiconductor wafer 10 into individual chips, whereby the semiconductor chips of the RC-IGBT 20 are completed.

Instead of the helium irradiation 32, defects that become a carrier lifetime killer may be induced by proton (W)

irradiation. Instead of performing the helium irradiation 32 from the front surface 10a of the semiconductor wafer 10, helium irradiation (not depicted) may be performed from the back surface 10b of the semiconductor wafer 10. In this instance, a photoresist film (not depicted) opened at portions corresponding to the FWD regions 22 is formed on the back surface 10b of the semiconductor wafer 10. Subsequently, the helium irradiation is performed from the back surface 10b of the semiconductor wafer 10, using this photoresist film as a mask (shielding film).

In an instance in which helium irradiation is performed from the back surface 10b of the semiconductor wafer 10, an injection depth (range) of the helium is, for example, about 100 μm from the back surface 10b of the semiconductor wafer 10. Therefore, to enable the photoresist film to function as a shielding film, a thickness of the photoresist film 31, for example, is set to be at least about 220 μm. As a result, similarly to the helium irradiation 32 from the front surface 10a of the semiconductor wafer 10, the He defects 15 are induced in only the FWD regions 22 without being induced in the IGBT regions 21 covered by the photoresist film.

Figure 3:
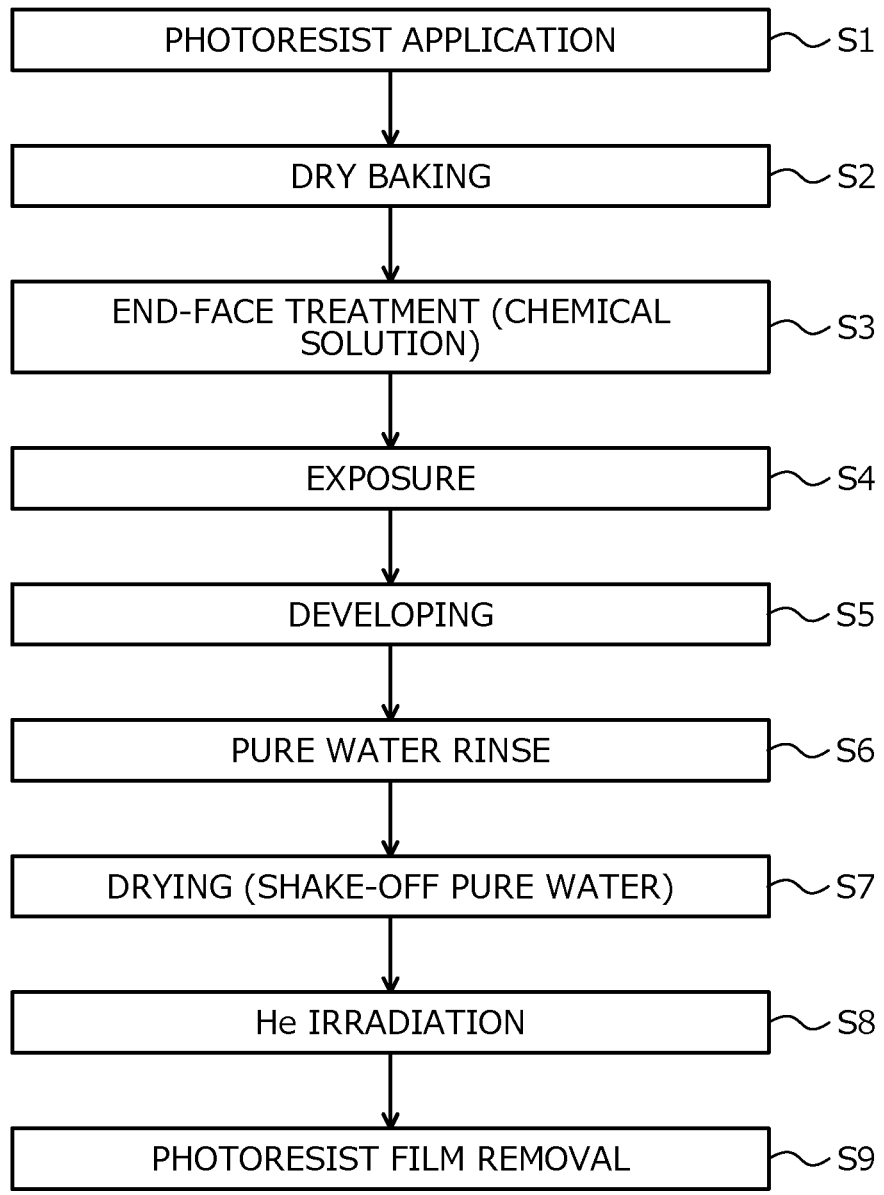
FIG. 3 is a flowchart depicting an outline of a portion of processes of a method of manufacturing the semiconductor device according to the first embodiment.

Next, the processes performed between the formation and removal of the photoresist film 31 are described in detail taking, as an example, an instance in which the helium irradiation 32 is performed from the front surface 10a of the semiconductor wafer 10. FIG. 3 is a flowchart depicting an outline of a portion of the processes of the method of manufacturing the semiconductor device according to the first embodiment. FIG. 3 depicts, in sequence, an outline of the processes performed between the formation and the removal of the photoresist film 31 used as a shielding film to induce the He defects 15 only in the FWD regions 22 by the helium irradiation 32 to the semiconductor wafer 10.

First, photoresist applied to (dripped on) the front surface 10a of the semiconductor wafer 10 is spread in an entire area of the front surface 10a of the semiconductor wafer 10 by rotating the semiconductor wafer 10 around a center axis orthogonal to a main surface of the semiconductor wafer 10, whereby the photoresist film 31 is formed (step S1: formation process). In the process at step S1, viscosity and/or solvent type of the photoresist, rotational speed of the semiconductor wafer 10, etc. are adjusted to form the photoresist film 31 having the predetermined thickness t1 necessary for use of the photoresist film 31 as a shielding film in the helium irradiation 32 described hereinafter.

For a material of the photoresist film 31, a positive type or a negative type photoresist may be used, a chemically amplified photoresist may be used. A chemically amplified photoresist is a photosensitive material mixed with a resin, an acid generator, and a solvent, and is more reactive to light as compared to normal photoresist and thereby enables reduction of exposure time. The greater is the thickness t1 of the photoresist film 31, the more time the later-described exposure takes and therefore, use of a chemically amplified photoresist as a material of the photoresist film 31 may be preferable.

Next, the entire the semiconductor wafer 10 is heated (hereinafter, dry baking) and solvent and water in the photoresist film 31 are evaporated, whereby the photoresist film 31 is dried and hardened (step S2). Next, a chemical solution is dripped on an end of the photoresist film 31 and from the end of the photoresist film 31, a portion thereof having a predetermined width is dissolved and removed, spanning an entire perimeter of the photoresist film 31 (step S3). By the process at step S3, along an entire periphery 10d of the semiconductor wafer 10, a predetermined width w11 thereof (Refer to FIG. 1) is exposed (end-face treatment of the semiconductor wafer 10).

The periphery 10d of the semiconductor wafer 10 is a portion thereof surrounding a periphery of the center portion (portion in which the chip regions 10c and the dicing lines 31b are formed) of the semiconductor wafer 10, a non-operating region that is not used as a semiconductor chip. In particular, the periphery 10d of the semiconductor wafer 10 is a portion held by a transport hand (not depicted) or a portion in contact with a sidewall of a groove (hereinafter, storage groove) provided in a pectinate shape in an inner wall of a wafer cassette (not depicted), during transport of the semiconductor wafer 10 in processes at step S3 and thereafter.

The photoresist film 31 has already been hardened by the dry baking at step S2 and therefore, even when the thickness t1 of the photoresist film 31 is increased, the shape of the newly exposed end-face of the photoresist film 31 is retained at step S3. The photoresist film 31 does not flow out into the periphery 10d of the semiconductor wafer 10 and therefore, the entire periphery 10d of the semiconductor wafer 10 is exposed completely by the predetermined width w11. Therefore, in processes subsequent to step S3, the photoresist film 31 at the transport hand or the storage groove of the wafer cassette does not come in contact with a stage, etc. of manufacturing equipment.

Next, by an exposure apparatus (stepper, not depicted), exposure is performed through a mask (reticle) while an entire area of the surface of the semiconductor wafer 10 is scanned, whereby a predetermined mask pattern is transferred to the photoresist film 31 (step S4). Next, after a post exposure bake ((PEB) baking after exposure), by developing equipment, predetermined portions of the photoresist film 31 are melted, a pattern of the openings 31a is developed, and portions of the photoresist film 31 corresponding to the FWD regions 22 are opened (step S5: developing process).

End-faces 31c of the pattern of the photoresist film 31 are substantially orthogonal to the front surface 10a of the semiconductor wafer 10 and the thickness t1 of the photoresist film 31 is substantially uniform. The thickness being substantially uniform means that the thickness is the same by a range that includes allowable error due to process variation. The thickness t1 of the photoresist film 31 is substantially uniform, whereby helium does not penetrate through during the helium irradiation 32 and therefore, introduction of the helium into portions of the semiconductor wafer 10 other than the portions exposed in the openings 31a of the photoresist film 31 may be prevented.

In an instance in which a positive-type photoresist is used as the photoresist film 31, ultraviolet (UV) curing or post baking (post bake) conventionally performed between step S5 and step S6 is not performed. A reason for this is that in an instance in which UV curing or post baking is performed, when the thickness t1 of the photoresist film 31 is thick, the end-faces 31c of the pattern of the photoresist film 31 are deformed, becoming tilted and at the tilted portions, the thickness t1 of the photoresist film 31 decreases.

During the helium irradiation 32, helium penetrates through from the portions that are thinner than the thickness t1 of the photoresist film 31 and is introduced into the IGBT regions 21, whereby IGBT gate threshold varies and leak current increases. The end-faces 31c of the pattern of the photoresist film 31 are side surfaces of the photoresist film 31 exposed in the openings 31a thereof. By not performing the UV curing or the post baking, the pattern shape and the thickness t1 of the photoresist film 31 after step S5 may be maintained.

On the other hand, in an instance in which a positive-type photoresist is used as a material of the photoresist film 31, and the UV curing or the post baking conventionally performed between step S5 and step S6 are not performed, the surface of the photoresist film 31 undergoes a change in quality during the helium irradiation 32 and the photoresist film 31 becomes difficult to remove by the organic solvent treatment or the incineration treatment thereafter. Therefore, preferably, acceleration energy of the helium irradiation 32 may be kept low to prevent changes in quality of the surface of the photoresist film 31 during the helium irradiation 32.

In an instance in which a negative-type photoresist is used as a material of the photoresist film 31, in general, as compared to a positive-type photoresist, heat resistance is high and therefore, in an instance of use as a material of the photoresist film 31 described above, the problems that occur when a positive-type photoresist is used do not occur. Therefore, UV curing or post baking like that conventionally performed may be performed between step S5 and step S6. Further, the thickness t1 of the photoresist film 31 may be increased and the helium irradiation 32 may be performed having a deep range without a need to suppress conditions of a does amount, acceleration energy, etc. of the helium irradiation 32.

Next, by a general method, the semiconductor wafer 10 is cleaned with water such as pure water (washed with water: rinsed with pure water) (step S6: cleaning process). Next, the semiconductor wafer 10 is placed on and fixed to a spinner (rotating support stage that fixes the semiconductor wafer 10, not depicted), with the back surface 10b of the semiconductor wafer 10 facing downward (facing the rotating support stage). Next, force of a motor is transmitted to the rotating support stage, whereby the semiconductor wafer 10 is rotated around the center axis orthogonal to a main surface of the semiconductor wafer 10, at a high predetermined rotational speed, for one session (one stage) of a predetermined period (for example, about 15). Centrifugal force generated by this high-speed rotation is used to cause the water left on the surface of the semiconductor wafer 10 and in the openings 31a of the photoresist film 31 to fly off therefrom, whereby the semiconductor wafer 10 is dried (step S7: drying process).

A rotation period of one stage for the semiconductor wafer 10 may be variously changed provided sufficient drying of the semiconductor wafer 10 is obtained. In the process at step S7 for the semiconductor wafer 10, the semiconductor wafer 10 is rotated at a high rotational speed sufficient to generate a centrifugal force capable of causing the water that is left on the surface of the semiconductor wafer 10 and in the openings 31a of the photoresist film 31 to fly off therefrom. In particular, the rotational speed during drying of the semiconductor wafer 10 is, for example, at least about 1000 [revolutions per minute (rpm)] and may be preferably at least about 1500 [rpm]. Conditions of the upper limit and the lower limit (hereinafter, upper limit rotational speed and lower limit rotational speed, respectively) of the rotational speed during drying of the semiconductor wafer 10, as described hereinafter, vary depending on a diameter of the semiconductor wafer 10.

The upper limit rotational speed during drying of the semiconductor wafer 10 is set according to the diameter (wafer diameter) [mm] of the semiconductor wafer 10, the thickness t1 [μm] of the photoresist film 31, and a volume [mm$^3$] of the openings 31a of the photoresist film 31. As a result, even in an instance in which the opening area (planar area) of each of the openings 31a of the photoresist film 31 is large, for example, at least about 1 mm$^2$, an occurrence of cracks in the photoresist film 31 may be prevented. In particular, in an instance in which the semiconductor wafer 10 used, for example, has a diameter of 8 inches, the upper limit rotational speed during drying of the semiconductor wafer 10 is as follows.

FIG. 4 is a table depicting a relationship between photoresist film thickness and rotational speed during drying of the semiconductor wafer. Results of verification of shielding performance by an experiment in which the rotational speed during drying of the semiconductor wafer was varied are depicted in FIG. 4. In FIG. 4, "a" means that the photoresist film 31 could block the helium of the helium irradiation 32. "x" means that the helium of the helium irradiation 32 could not be blocked at places where cracks (corresponds to reference character 121b in FIG. 13) occurred in the photoresist film 31 (helium of the helium irradiation 32 penetrated through).

FIG. 4 depicts verification results for multiple samples (hereinafter, experimental examples) into which helium was introduced by the helium irradiation 32 that is performed through the photoresist film 31 into the semiconductor wafer 10 having an 8 inch diameter. The thickness t1 of the photoresist films 31 of the samples of the experimental examples differed. In the samples of the experimental examples, the shape of the openings 31a of the photoresist film 31 in a plan view thereof was substantially rectangular and the volume [mm$^3$] of the openings 31a was 10 mm×0.3 mm×the thickness t1. The volume of the openings 31a of the photoresist film 31 is a maximum volume of water (pure water) left in one of the openings 31a of the photoresist film 31 by the process (washing with water) at step S6.

Of the samples of the experimental examples depicted in FIG. 4, samples for which the verification result is "a" were confirmed to have no occurrence of cracks in the photoresist film 31 during drying the semiconductor wafer 10. The following conditions were set for the samples for which the verification result is "o" in FIG. 4. In an instance in which the thickness t1 of the photoresist film 31 was at most 40 μm, the settable upper limit rotational speed of the semiconductor wafer 10 during drying of the semiconductor wafer 10 was 3000 rpm. In an instance in which the thickness t1 of the photoresist film 31 was more than 40 μm but not more than 50 μm, the settable upper limit rotational speed of the semiconductor wafer 10 during drying of the semiconductor wafer 10 was 2500 rpm.

In an instance in which the thickness t1 of the photoresist film 31 was more than 50 μm but not more than 70 μm, the settable upper limit rotational speed of the semiconductor wafer 10 during drying of the semiconductor wafer 10 was 2000 rpm. In an instance in which the thickness t1 of the photoresist film 31 was more than 70 μm but not more than 100 μm, the settable upper limit rotational speed of the semiconductor wafer 10 during drying of the semiconductor wafer 10 was 1500 rpm. In an instance in which the thickness t1 of the photoresist film 31 was more than 100 μm but not more than 220 μm, the settable upper limit rotational speed of the semiconductor wafer 10 during drying of the semiconductor wafer 10 was 1000 rpm.

On the other hand, in samples for which the verification result is "x" of the samples of the experimental examples depicted in FIG. 4, the openings 31a of the photoresist film 31 each having a closed, substantially rectangular shape in a plan view thereof have a corner portion where the strength against the centrifugal force is lowest and from the corner portion, in an oblique direction of substantially 45 degrees with respect to a sidewall of the openings 31, an occurrence of cracking toward an end of the photoresist film 31 was confirmed. The samples for which the verification result is "x" in FIG. 4 are samples in which the semiconductor wafer 10 was rotated at a rotational speed that exceeded the settable upper limit rotational speed of the semiconductor wafer 10 during drying of the semiconductor wafer 10.

Figure 5:
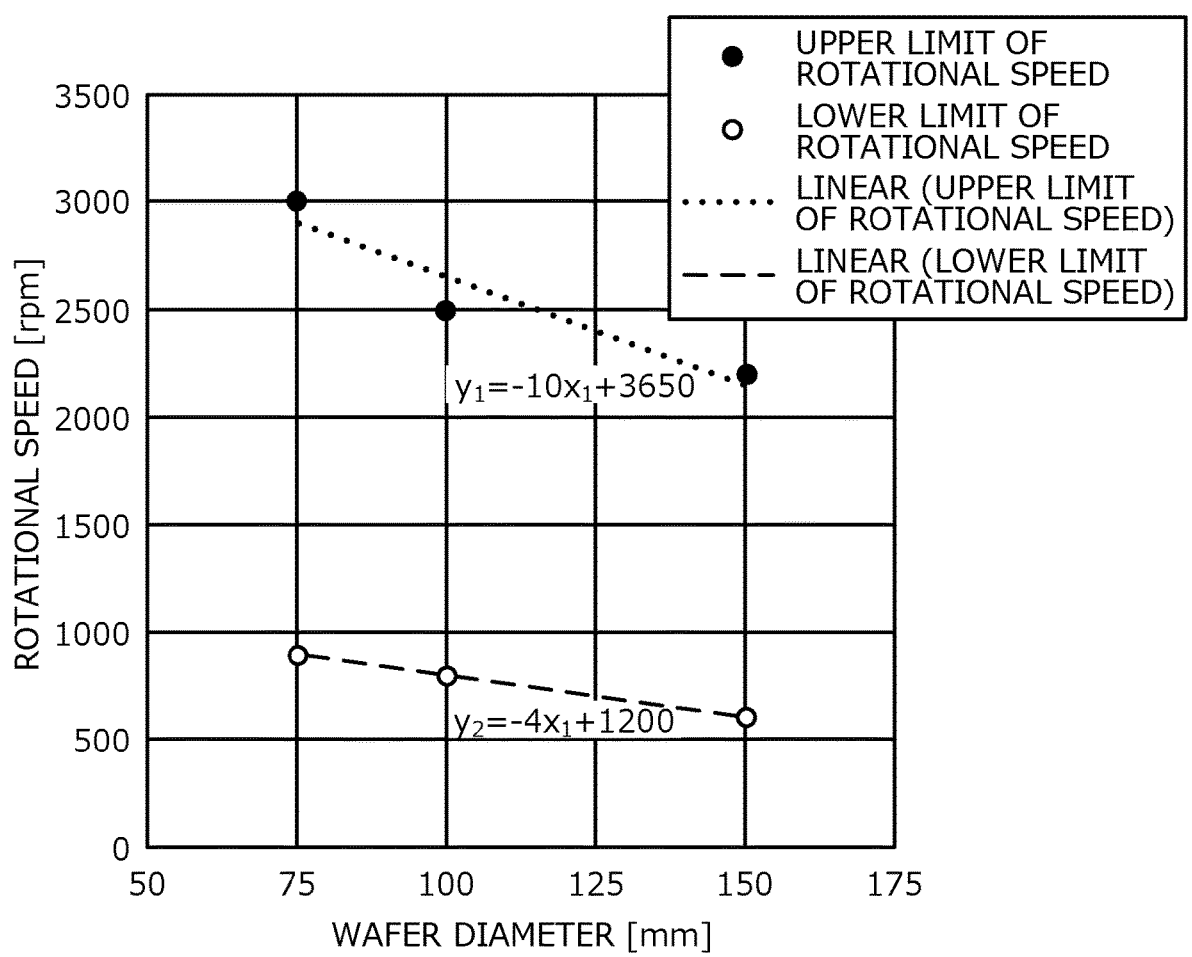
FIG. 5 is a characteristics diagram depicting a relationship between semiconductor wafer diameter and rotational speed of the semiconductor wafer during drying thereof.

Further, a relationship between the diameter of the semiconductor wafer 10 and the rotational speed during drying of the semiconductor wafer was calculated from the results depicted in FIG. 4 and the results of the calculation are depicted in FIG. 5. FIG. 5 is a characteristics diagram depicting a relationship between semiconductor wafer diameter when the photoresist thickness is 50 µm and rotational speed of the semiconductor wafer during drying thereof. First, for each of the samples for which the verification result was "a" of the samples of the experimental examples, the force of the water colliding against the sidewalls of the openings 31a of the photoresist film 31 near an outer periphery of the semiconductor wafer 10 when the semiconductor wafer 10 was rotated at a high speed during drying of the semiconductor wafer 10 was calculated.

In particular, near the outer periphery of the semiconductor wafer 10, the force of the water colliding with the sidewalls of the openings 31a of the photoresist film 31 was assumed to be the centrifugal force generated near the outer periphery of the semiconductor wafer 10 by the water that fills one of the openings 31a of the photoresist film 31, when the semiconductor wafer 10 is rotated at a high speed. More specifically, the centrifugal force is an arithmetic product of the volume of one of the openings 31a of the photoresist film 31 (i.e., the mass [g] of the water completely filling one of the openings 31a) and a square of the angular velocity [m/s] corresponding to the rotational speed of the semiconductor wafer 10.

As a result, it was confirmed that for all of samples for which the verification result was "○" of the samples of the experimental examples, the centrifugal force was at most 1.2 [N]. Here, conditions identical to those of the samples of the experimental examples were assumed for the volume [mm³] of the openings 31a of the photoresist film 31. Therefore, when the semiconductor wafer 10 is rotated at a high speed and the force of the water colliding with the sidewalls of the openings 31a of the photoresist film 31 near the outer periphery of the semiconductor wafer 10 (the centrifugal force near the outer periphery of the semiconductor wafer 10) is at most 1.2N, cracks do not occur in the photoresist film 31.

Thus, for instances in which the semiconductor wafer 10 has a diameter of 75 mm (corresponds to the semiconductor wafer 10 having a 6-inch diameter), 100 mm (corresponds to the semiconductor wafer 10 having an 8-inch diameter), and 300 mm, conditions of the rotational speed during drying of the semiconductor wafer were calculated. In particular, for instances in which the semiconductor wafer 10 had these diameters, the thickness t1 of the photoresist film 31 was varied and the rotational speed during drying of the semiconductor wafer when the force of the water colliding with the sidewalls of the openings 31a of the photoresist film 31 near the outer periphery of the semiconductor wafer 10 is equal to that of the samples for which the verification result was "○" of the samples of the experimental examples (i.e., centrifugal force is at most 1.2N) was calculated.

As depicted in FIG. 5, when the diameter of the semiconductor wafer 10 is 75 mm, the settable upper limit rotational speed and the settable lower limit rotational speed of the semiconductor wafer 10 during drying of the semiconductor wafer 10 are 3000 rpm and 900 rpm, respectively. When the diameter of the semiconductor wafer 10 is 100 mm, the settable upper limit rotational speed and the settable lower limit rotational speed of the semiconductor wafer 10 during drying of the semiconductor wafer 10 are 2500 rpm and 800 rpm, respectively. When the diameter of the semiconductor wafer 10 is 150 mm, the settable upper limit rotational speed and the settable lower limit rotational speed of the semiconductor wafer 10 during drying of the semiconductor wafer 10 are 2200 rpm and 600 rpm, respectively.

Based on these calculated values of the settable upper limit rotational speed and the settable lower limit rotational speed of the semiconductor wafer 10 during drying of the semiconductor wafer 10, a settable upper limit rotational speed $y_1$ [rpm] and a settable lower limit rotational speed $y_2$ [rpm] of the semiconductor wafer 10 during drying of the semiconductor wafer 10 and a diameter of the semiconductor wafer 10 $x_1$ [mm] may be expressed by equation (1) and equation (2) below. From equation (1) and equation (2), it is found that the settable rotational speed of the semiconductor wafer 10 during drying of the semiconductor wafer 10 has to be reduced the greater is the diameter $x_1$ of the semiconductor wafer 10.

$$y_1 = -10x_1 + 3650 \tag{1}$$

$$y_2 = -4x_1 + 1200 \tag{2}$$

Figure 6:
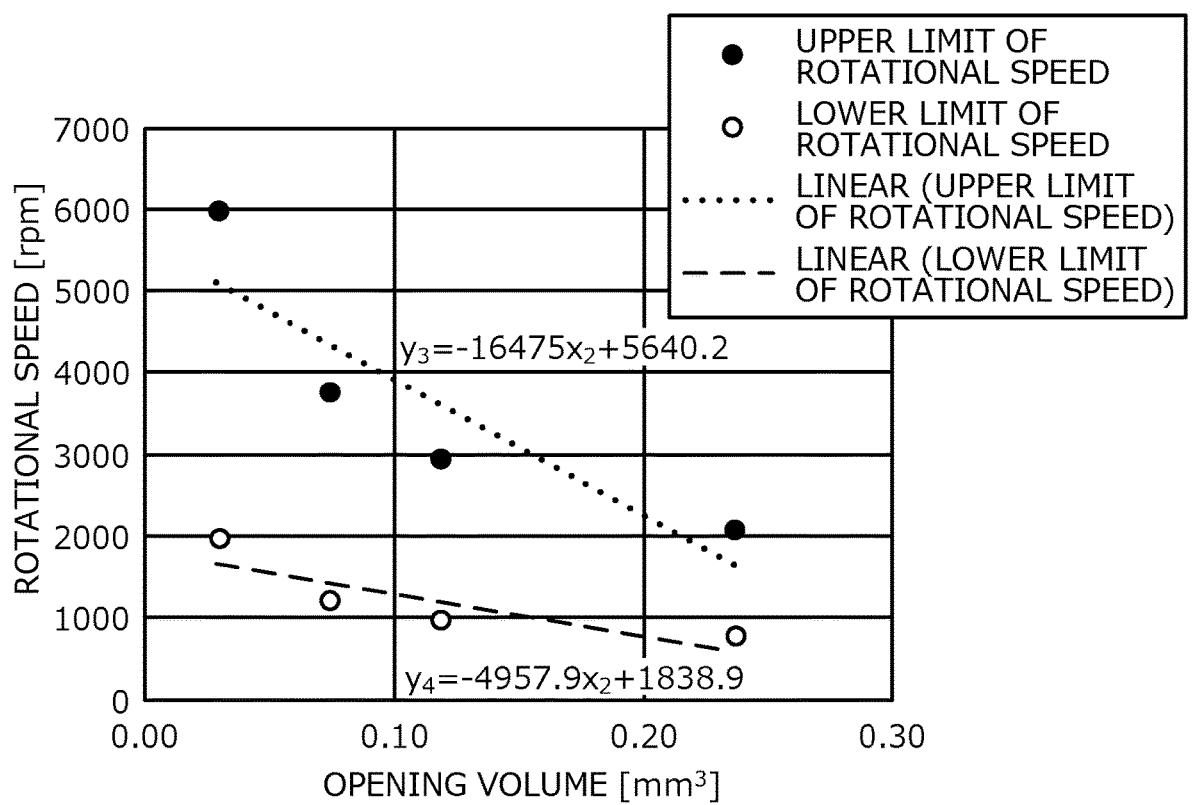
FIG. 6 is a characteristics diagram depicting a relationship between opening volume of a photoresist film and rotational speed of the semiconductor wafer during drying thereof.

Further, a relationship between the volume of the openings 31a of the photoresist film 31 and the rotational speed during drying of the semiconductor wafer was calculated from the results depicted in FIG. 4, results of the calculation are depicted in FIG. 6. FIG. 6 is a characteristics diagram depicting a relationship between opening volume of the photoresist film and the rotational speed of the semiconductor wafer during drying thereof. In an instance in which the semiconductor wafer 10 has an 8-inch diameter, the volume of the openings 31a and the thickness t1 of the photoresist film 31 were varied, and the rotational speed during drying of the semiconductor wafer when the force of the water colliding with the sidewalls of the openings 31a of the photoresist film 31 near the outer periphery of the semiconductor wafer 10 is at most 1.2N was calculated.

As depicted in FIG. 6, when the volume of the openings 31a of the photoresist film 31 is 0.03 [mm³], the settable upper limit rotational speed and the settable lower limit rotational speed of the semiconductor wafer 10 during drying of the semiconductor wafer 10 are 6000 rpm and 2000 rpm, respectively. When the volume of the openings 31a of the photoresist film 31 is 0.08 [mm³], the settable upper limit rotational speed and the settable lower limit rotational speed of the semiconductor wafer 10 during drying of the semiconductor wafer 10 are 3850 rpm and 1250 rpm, respectively.

When the volume of the openings 31a of the photoresist film 31 is 0.12 [mm³], the settable upper limit rotational speed and the settable lower limit rotational speed of the semiconductor wafer 10 during drying of the semiconductor wafer 10 are 3000 rpm and 1000 rpm, respectively. When the volume of the openings 31a of the photoresist film 31 is 0.24 [mm³], the settable upper limit rotational speed and the settable lower limit rotational speed of the semiconductor wafer 10 during drying of the semiconductor wafer 10 are 2100 rpm and 800 rpm, respectively.

Based on these calculated values of the settable upper limit rotational speed and the settable lower limit rotational speed of the semiconductor wafer 10 during drying of the semiconductor wafer 10, a settable upper limit rotational speed $y_3$ [rpm] and a settable lower limit rotational speed $y_4$ [rpm] of the semiconductor wafer 10 during drying thereof and the volume of the openings 31a of the photoresist film 31 $x_2$ [mm$^3$] may be expressed by equation (3) and equation (4) below. From equation (3) and equation (4), it is found that the settable rotational speed of the semiconductor wafer 10 during drying of the semiconductor wafer 10 has to be reduced the greater is the volume $x_2$ of the openings 31a of the photoresist film 31.

$$y_3 = -16475x_2 + 5640.2 \quad (3)$$

$$y_4 = -4957.9x_2 + 1838.9 \quad (4)$$

Next, the helium irradiation 32 is performed from the front surface 10a of the semiconductor wafer 10, using the photoresist film 31 as a mask (step S8: injection process). By the process at step S8, helium is introduced into the semiconductor wafer 10 from the openings 31a of the photoresist film 31 as described above, thereby forming the He defects 15 only in the FWD regions 22 (refer to FIG. 2). Thereafter, by an organic solvent treatment or an incineration treatment (ashing), the photoresist film 31 is removed (step S9), whereby a series of processes for performing the helium irradiation 32 is completed.

Even when helium irradiation is performed to the FWD regions 22 from the back surface 10b of the semiconductor wafer 10 using the photoresist film 31 as a mask, the series of processes for performing the described helium irradiation 32 from the front surface 10a of the semiconductor wafer 10 is applicable. In an instance in which helium irradiation is performed to the FWD regions 22 from the back surface 10b of the semiconductor wafer 10, the thickness t1 of the photoresist film 31 is relatively thick and therefore, for example, a negative-type photoresist or a chemically amplified photoresist suffices to be used as a material of the photoresist film 31.

As described above, according to the present embodiment, in drying the semiconductor wafer by using centrifugal force generated by rotating the semiconductor wafer at a high speed to cause the water on the surface of the semiconductor wafer to fly off therefrom, the rotational speed of the semiconductor wafer is set to be at most the upper limit rotational speed prescribed according to the thickness of the photoresist film. As a result, the force by which water that is left in the openings of the photoresist film by the washing of the semiconductor wafer with water after development collides with the sidewalls of the openings by being subject to centrifugal force may be reduced, whereby cracking of the photoresist film may be suppressed.

Further, according to the present embodiment, by suppressing cracking of the photoresist film, helium irradiation may be performed in only predetermined portions (FWD regions in an instance of fabrication of RC-IGBTs) of the semiconductor wafer with positioning accuracy. Further, according to the present embodiment, in fabricating the RC-IGBTs, helium is not introduced into the IGBT region and therefore, degradation of characteristics (low ON resistance Von and low leak current) of the IGBT regions may be prevented.

Figure 7:
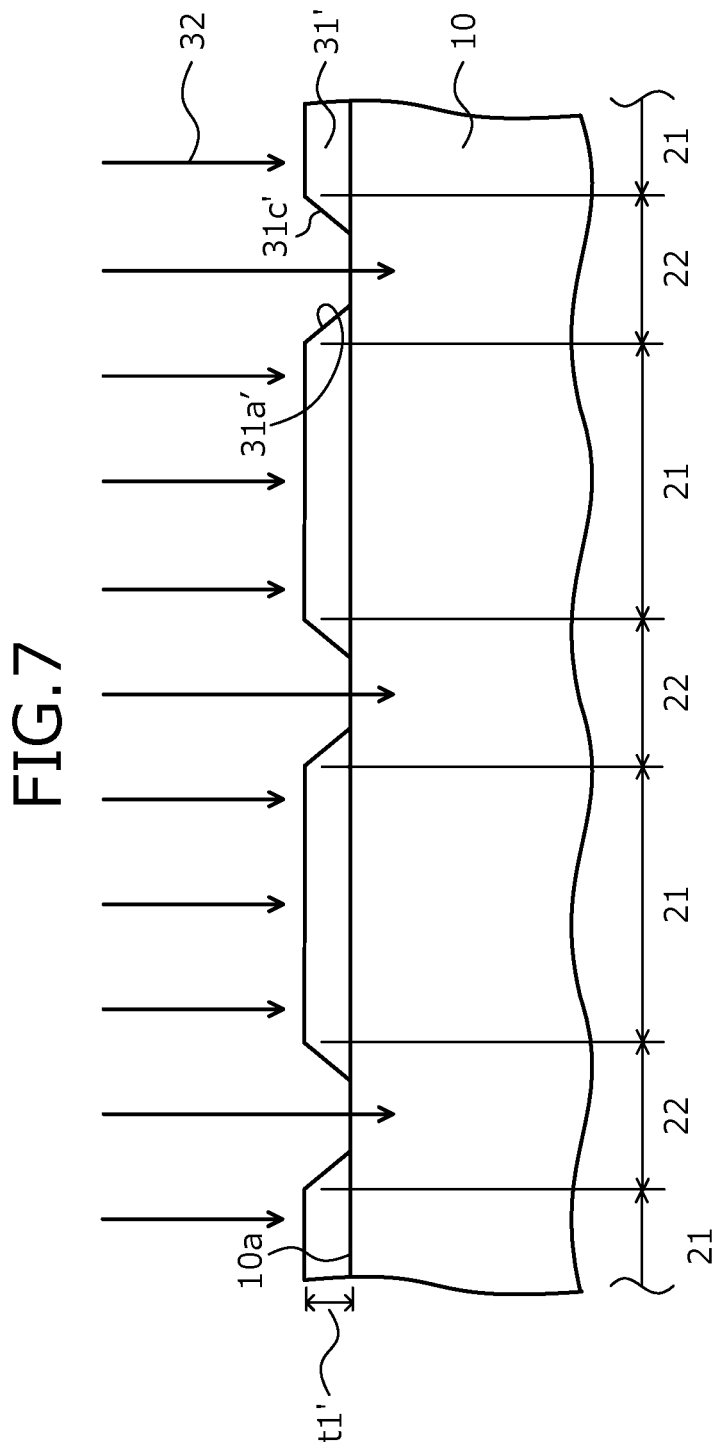
FIG. 7 is a cross-sectional view of a state of a semiconductor device according to a second embodiment during manufacture.
Figure 8:
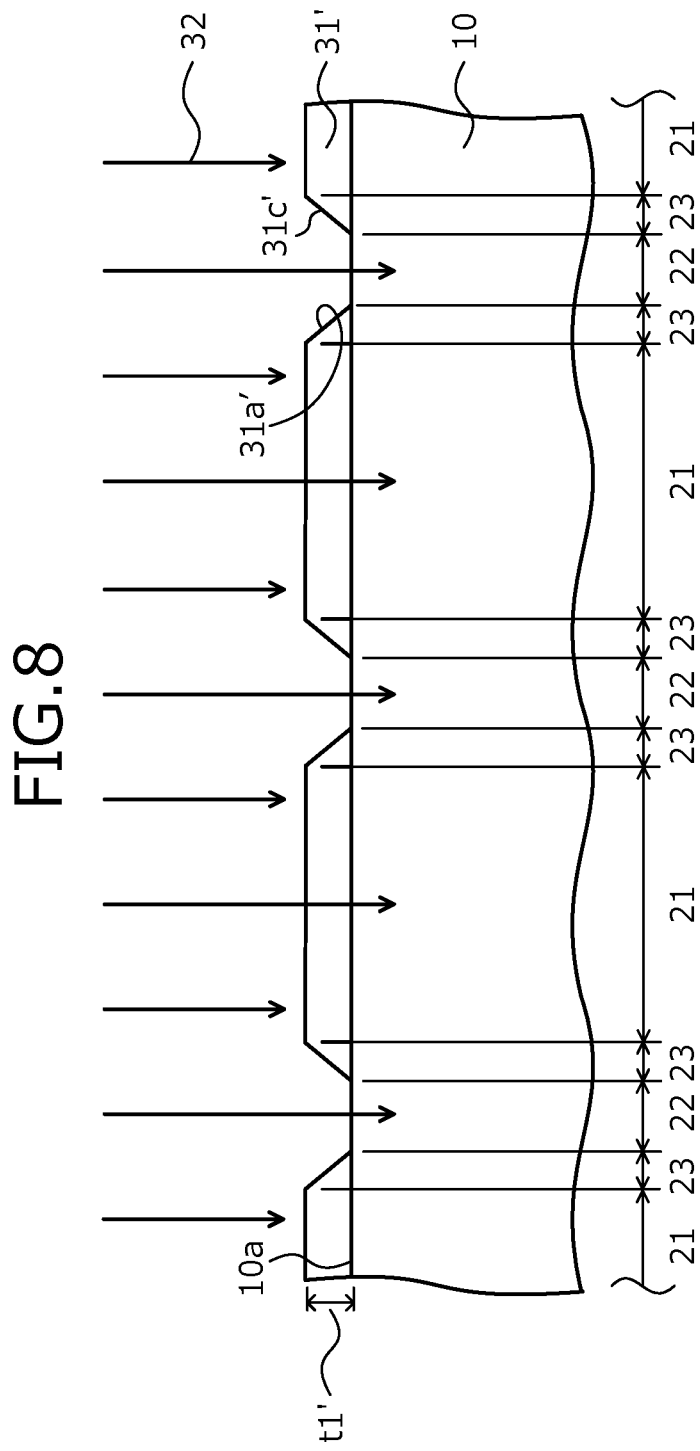
FIG. 8 is a cross-sectional view of a state of the semiconductor device according to the second embodiment during manufacture.
Figure 9:
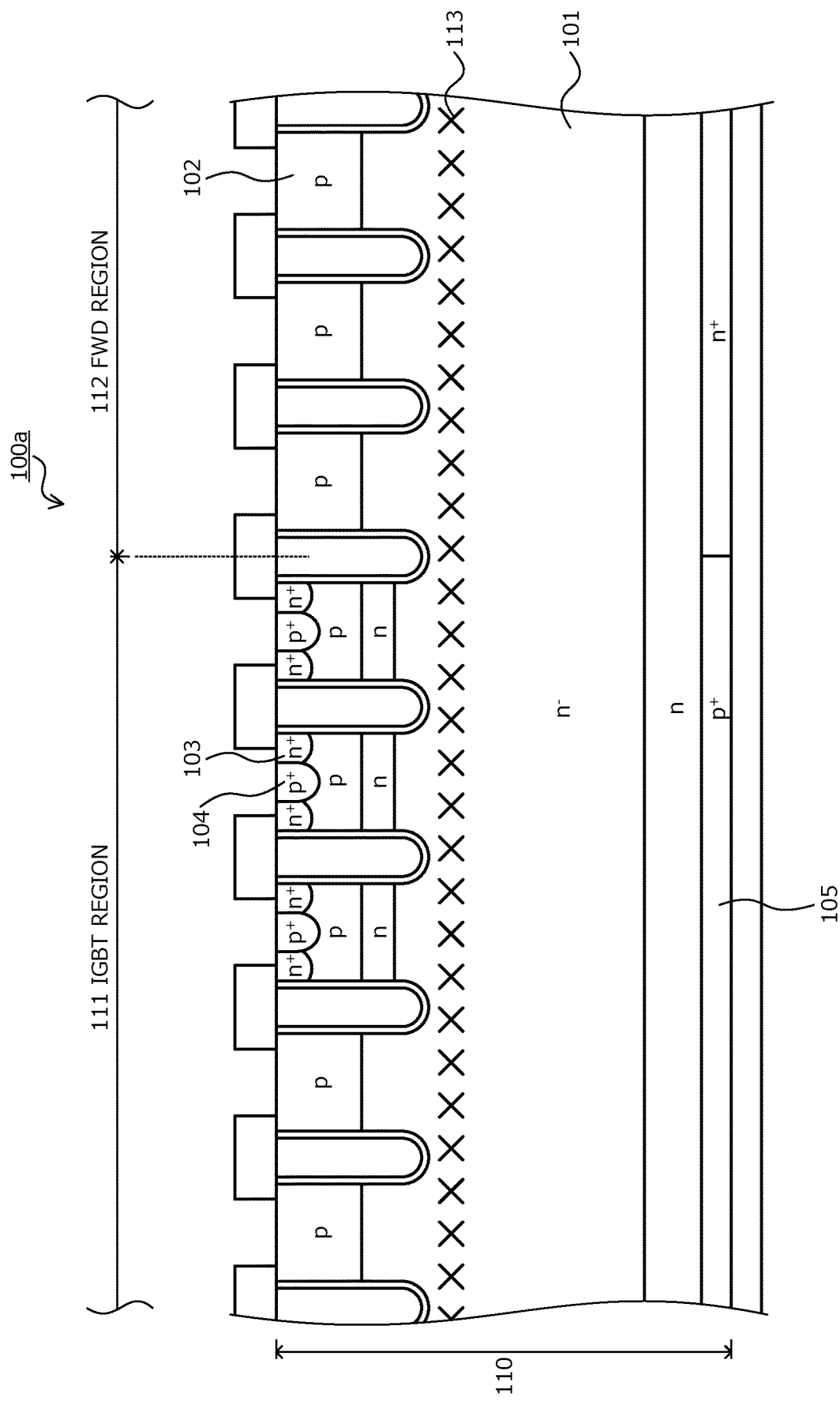
FIG. 9 is a cross-sectional view of a structure of a conventional semiconductor device.

Next, a method of manufacturing a semiconductor device according to a second embodiment is described. FIGS. 7 and 8 are cross-sectional views of states of the semiconductor device according to the second embodiment during manufacture. FIGS. 7 and 8 depict states of the front surface 10a of the semiconductor wafer 10 during the helium irradiation 32 at step S8 depicted in FIG. 2. Further, in FIGS. 7 and 8, while device element structures formed in the semiconductor wafer 10 are not depicted, device element structures of the IGBT regions 21 and the FWD regions 22 formed in the semiconductor wafer 10 are similar to those depicted in FIG. 1.

The method of manufacturing the semiconductor device according to the second embodiment differs from the method of manufacturing the semiconductor device according to the first embodiment (Refer to FIG. 1) in that end-faces 31c' of a pattern of a photoresist film 31' used as a shielding film during the helium irradiation 32 at step S8 (refer to FIG. 2) are oblique with respect to the front surface 10a of the semiconductor wafer 10. The end-faces 31c' of the pattern of the photoresist film 31' are oblique, whereby the shape of each of the openings 31a' of the photoresist film 31' in a cross-sectional view thereof is a trapezoid shape in which an opening width progressively increases with increasing distance from the semiconductor wafer 10.

The thickness t1' of the photoresist film 31' is thinner at portions where the end-faces 31c' of the pattern of the photoresist film 31' are oblique. During the helium irradiation 32, helium penetrates through from these portions of the photoresist film 31' at the end-faces 31c' of the pattern where the thickness t1' is thinner, to be introduced into the semiconductor wafer 10. Therefore, the pattern of the photoresist film 31' is formed so that the portions of the photoresist film 31' at the end-faces 31c' of the pattern where the thickness t1' is thinner are positioned in the FWD regions 22 (FIG. 7).

Non-operating regions 23 may be provided between the IGBT regions 21 and the FWD regions 22, and the pattern of the photoresist film 31' may be formed so that the portions of the photoresist film 31' at the end-faces 31c' of the pattern where the thickness t1' is thinner are positioned in the non-operating regions 2 (FIG. 8). The non-operating regions 23 are, for example, regions that do not operate as a semiconductor device element (i.e., regions in which predetermined device elements are not formed), regions that have an IGBT of the IGBT regions 21 or a FWD of the FWD regions 22 but do not obtain desired characteristics of the device element structure, etc.

As described above, according to the second embodiment, even when the thickness of the photoresist film becomes thinner at the end-faces of the pattern of the photoresist film used as a shielding film during the helium irradiation, the photoresist film is formed so that the portions of the photoresist film at the end-faces of the pattern where the thickness of the photoresist film is thinner are positioned in a FWD region or a non-operating region, whereby effects similar to those of the first embodiment may be obtained.

Next, a method of manufacturing a semiconductor device according to a third embodiment is described. The method of manufacturing the semiconductor device according to the third embodiment differs from the method of manufacturing the semiconductor device according to the first embodiment (refer to FIGS. 1 and 2) in that during the process (drying of the semiconductor wafer 10) at step S7, the semiconductor wafer 10 is rotated at a high speed for two consecutive sessions (two stages) of different rotational speeds to cause the water (pure water) left on the surface of the semiconductor wafer 10 and in the openings 31a of the photoresist film 31 to fly off therefrom.

In the third embodiment, in the process at step S7, first, a first-stage high-speed rotation of the semiconductor wafer 10 is performed by a rotational speed set by criteria similar to the criteria of the first embodiment (refer to FIGS. 4 to 6), whereby a predetermined volume of the water left in the openings 31a of the photoresist film 31 is caused to fly off therefrom. The rotational speed of the first-stage high-speed rotation of the semiconductor wafer 10 is set by criteria similar to the criteria of the first embodiment, whereby similarly to the first embodiment, an occurrence of cracking of the photoresist film 31 due to the first-stage high-speed rotation may be prevented.

Subsequently, following the first-stage high-speed rotation of the semiconductor wafer 10, at least the rotational speed is set to a condition different from that of the rotational speed of the first-stage high-speed rotation of the semiconductor wafer 10 and a second-stage high-speed rotation of the semiconductor wafer 10 is performed. In the second-stage high-speed rotation of the semiconductor wafer 10, all of the water left in the openings 31a of the photoresist film 31 is caused to fly out therefrom, thereby drying the semiconductor wafer 10. A method of the high-speed rotation of the semiconductor wafer 10 is similar to that of the first embodiment.

The second-stage high-speed rotation of the semiconductor wafer 10, for example, may be performed at a rotational speed higher than that of the first-stage high-speed rotation of the semiconductor wafer 10. A reason for this is that the force of the water colliding with the sidewalls of the openings 31a of the photoresist film 31 during the second-stage high-speed rotation of the semiconductor wafer 10 decreases by the amount by which the volume of water left in the openings 31a of the photoresist film 31 is reduced by the first-stage high-speed rotation of the semiconductor wafer 10.

For example, the thickness t1 of the photoresist film 31 is assumed to be 40 µm. Further, the first-stage high-speed rotation for drying the semiconductor wafer 10 is assumed to be performed, for example, for about 5 seconds at 3000 rpm, which is the settable upper limit rotational speed when the thickness t1 of the photoresist film 31 is at most 40 µm (refer to FIG. 4). Thereafter, the second-stage high-speed rotation for drying the semiconductor wafer 10 is performed at a rotation speed higher than that of the first-stage high-speed rotation for drying the semiconductor wafer 10, for example, 3500 rpm.

A total rotation period of the two-stage high-speed rotation of the semiconductor wafer 10 (processing time of step S7), as compared to an instance in which the high-speed rotation of the semiconductor wafer 10 is performed in one stage, may be shortened by an amount corresponding to an extent to which the rotational speed of the second-stage high-speed rotation for drying the semiconductor wafer 10 is increased. For example, the rotation period of the second stage for drying the semiconductor wafer 10 is, for example, about 7 seconds.

The third embodiment (process of drying the semiconductor wafer 10 by two-stage high-speed rotation of the semiconductor wafer 10) may be applied to the method of manufacturing the semiconductor device according to the second embodiment.

As described above, according to the third embodiment, effects similar to those of the first and the second embodiments may be obtained. Further, according to the third embodiment, the semiconductor wafer is rotated at a high speed for two consecutive sessions (two stages) of different rotational speeds to dry the semiconductor wafer, whereby the drying time of the semiconductor wafer may be shortened.

In the foregoing, without limitation to the described embodiments above, various modifications within a range not departing from the spirit of the invention are possible. For example, the present invention is applicable to semiconductor devices having various types of device element structures formed by proton irradiation or ion-implantation of an impurity using, as a shielding film, a thick photoresist film having a thickness of at least about 20 µm and large openings each having an opening area of, for example, at least about 1 $mm^2$. Further, the present invention is similarly implemented when conductivity types (n-type, p-type) are reversed.

The method of manufacturing the semiconductor device according to embodiments of the present invention achieves an effect in that the force by which water that is left in the openings of the photoresist film by the process of washing with water, collides with the sidewalls of the openings by being subject to centrifugal force may be reduced, whereby cracking of the photoresist film may be suppressed.

As described above, the method of manufacturing the semiconductor device according to embodiments of the present invention is useful for semiconductor devices having device element structures formed by helium irradiation, proton irradiation, or ion-implantation of an impurity of a deep range by high acceleration energy, using, as a shielding film, a thick photoresist film having openings each having a large opening area, and is particularly suitable in an instance in which the diameter of the semiconductor wafer on which the device elements structure are formed is large, an instance in which a RC-IGBT is fabricated as a device element structure, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a semiconductor device, the method comprising:
   preparing a semiconductor wafer, the semiconductor wafer having a first main surface and a second main surface opposite to each other;
   a formation process including forming a photoresist film on the first main surface of the semiconductor wafer;
   a developing process including forming a pattern of a plurality of openings at predetermined positions in the photoresist film;
   a cleaning process including cleaning the semiconductor wafer with water after the developing process;
   a drying process including drying the semiconductor wafer by rotating the semiconductor wafer around a center axis that is orthogonal to the first main surface of the semiconductor wafer, to thereby generate a centrifugal force to cause the water that is left in the openings of the photoresist film after the cleaning process to fly off the semiconductor wafer; and
   an injection process including ion-implanting a predetermined impurity by a predetermined acceleration energy from the first main surface of the semiconductor wafer, using the photoresist film as a mask, after the drying process, wherein
   the drying process includes setting a rotational speed of the semiconductor wafer to be at most an upper limit value.

2. The method according to claim 1, wherein
   setting the rotational speed of the semiconductor wafer includes setting the rotational speed of the semiconductor wafer such that the centrifugal force at an outer periphery of the semiconductor wafer is at most 1.2N.

3. The method according to claim 1, wherein
the upper limit value of the rotational speed of the semiconductor wafer, y1, satisfies $y_1=-10x_1+3650$, wherein
$x1$ is a diameter of the semiconductor wafer.

4. The method according to claim 1, wherein
setting the rotational speed of the semiconductor wafer includes setting the rotational speed of the semiconductor wafer according to a volume of the openings of the photoresist film.

5. The method according to claim 4, wherein
the upper limit value of the rotational speed of the semiconductor wafer, y3, satisfies $y_3=-16475x_2+5640.2$, where
$x2$ is the volume of the openings of the photoresist film.

6. The method according to claim 1, wherein
in the drying process, the semiconductor wafer is dried by a single rotation session.

7. The method according to claim 1, wherein
the drying process further includes a first rotation session of rotating the semiconductor wafer by a first rotational speed, followed by a second rotation session of rotating the semiconductor wafer by a second rotational speed higher than the first rotational speed.

8. The method according to claim 1, wherein
the formation process includes forming the photoresist film with a thickness of at least 20 μm.

9. The method according to claim 1, wherein
the developing process includes forming the plurality of openings, each in a rectangular shape in a plan view of the semiconductor wafer, and having an opening area that is at least 1 mm$^2$.

10. The method according to claim 1, wherein
the upper limit value corresponds to a thickness of the photoresist film.

* * * * *